(12) United States Patent
Ryu et al.

(10) Patent No.: US 8,350,617 B2
(45) Date of Patent: Jan. 8, 2013

(54) SEMICONDUCTOR APPARATUS

(75) Inventors: Je Il Ryu, Ichon-shi (KR); Junw Seop Jung, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 105 days.

(21) Appl. No.: 12/970,156

(22) Filed: Dec. 16, 2010

(65) Prior Publication Data
US 2012/0056666 A1 Mar. 8, 2012

(30) Foreign Application Priority Data
Sep. 3, 2010 (KR) .................. 10-2010-0086669

(51) Int. Cl.
G05F 1/10 (2006.01)

(52) U.S. Cl. ....................... 327/540; 327/536
(58) Field of Classification Search .................. 327/535, 327/536, 537, 538, 540, 543
See application file for complete search history.

(56) References Cited

U.S. PATENT DOCUMENTS

| 5,105,101 | A | 4/1992 | Hinooka | |
|---|---|---|---|---|
| 6,404,274 | B1 * | 6/2002 | Hosono et al. | 327/538 |
| 7,564,300 | B2 * | 7/2009 | Lee | 327/540 |
| 7,579,903 | B2 * | 8/2009 | Oku | 327/538 |
| 7,944,282 | B2 * | 5/2011 | Maejima | 327/538 |
| 7,990,778 | B2 * | 8/2011 | Oku | 365/189.09 |
| 8,183,913 | B2 * | 5/2012 | Swei et al. | 327/537 |
| 2002/0105452 | A1 | 8/2002 | Clapp et al. | |
| 2010/0142289 | A1 | 6/2010 | Oku | |

FOREIGN PATENT DOCUMENTS

| JP | 2007-312194 | | 11/2007 |
|---|---|---|---|
| KR | 1020070002997 | A | 1/2007 |
| KR | 1020070002997 | A | 1/2007 |
| KR | 100885489 | B1 | 2/2009 |

* cited by examiner

Primary Examiner — Jeffrey Zweizig
(74) Attorney, Agent, or Firm — William Park & Associates Ltd.

(57) ABSTRACT

Various embodiments of a semiconductor apparatus are disclosed. In one exemplary embodiment, the semiconductor apparatus may include an internal voltage generation unit configured to generate an internal voltage having a voltage level corresponding to a code value of a voltage control code, a voltage comparison unit configured to compare a voltage level of a target voltage with a voltage level of the internal voltage, and a voltage control code generation unit configured to adjust the code value of the voltage control code based on the comparison result of the voltage comparison unit.

22 Claims, 2 Drawing Sheets

SEMICONDUCTOR APPARATUS

CROSS-REFERENCE TO RELATED APPLICATION

The present application claims priority under 35 U.S.C. §119(a) to Korean Patent Application No. 10-2010-0086669, filed on Sep. 3, 2010, in the Korean Intellectual Property Office, which is incorporated herein by reference in its entirety as if set forth in full.

BACKGROUND

1. Technical Field

The present invention relates to a semiconductor apparatus, and more particularly, to a technology for trimming an internal voltage.

2. Related Art

Generally, in order to reduce power dissipation and effectively use voltages, a semiconductor apparatus is supplied with an external power to generate internal voltages with various voltage levels, and uses the internal voltages to operate various internal circuits.

Meanwhile, when the fabrication of a semiconductor apparatus is completed, a test apparatus is used to perform a trimming operation to adjust an internal voltage of the semiconductor apparatus to fall within a target voltage range. Conventionally, the test apparatus inputs a test code to the semiconductor apparatus, and the semiconductor apparatus adjusts a voltage level of an internal voltage according to the value of the inputted test code and outputs the adjusted internal voltage to a pad. The test apparatus monitors the internal voltage outputted through the pad of the semiconductor apparatus, and adjusts the value of the test code based on the monitoring result. The finally determined test code is stored in a code storage unit of the semiconductor apparatus. Such a conventional method for trimming an internal voltage has a problem in that the testing takes a significant amount of time because the test apparatus individually adjusts the test code, inputs the adjusted test code, and then monitors the internal voltage.

SUMMARY

Accordingly, there is a need for an improved semiconductor apparatus that may obviate the above-mentioned problem. It should be understood, however, that some aspects of the invention may not necessarily obviate the problem.

To attain the advantages and in accordance with the purpose of the invention, as embodied and broadly described herein, one aspect of the invention may provide a semiconductor apparatus comprising: an internal voltage generation unit configured to generate an internal voltage having a voltage level corresponding to a code value of a voltage control code; a voltage comparison unit configured to compare a voltage level of a target voltage with a voltage level of the internal voltage; and a voltage control code generation unit configured to adjust the code value of the voltage control code based on the comparison result of the voltage comparison unit.

In another exemplary aspect of the present invention, a semiconductor apparatus may includes: a plurality of internal voltage generation units configured to generate a plurality of internal voltages having voltage levels corresponding to code values of a plurality of voltage control codes, respectively; a voltage selection unit configured to select one internal voltage among the plurality of internal voltages based on a plurality of voltage selection signals and output the selected internal voltage as an output voltage; a first voltage division unit configured to divide the output voltage and output a first division voltage having a voltage level corresponding to a code value of a first control code; a second voltage division unit configured to divide a target voltage and output a second division voltage having a voltage level corresponding to a code value of a second control code; a voltage comparison unit configured to compare a voltage level of the first division voltage with a voltage level of the second division voltage; and a control unit configured to adjust the code value of the voltage control code selected among the plurality of voltage control codes based on the comparison result of the voltage comparison unit, and set the code values of the first and second control codes.

According to still another exemplary aspect, a semiconductor apparatus may include: a charge pumping unit configured to generate an internal voltage by performing a charge pumping based on a result of comparison between a reference voltage and a feedback voltage, and drive the generated internal voltage to an internal voltage terminal; a voltage division unit configured to divide a voltage of the internal voltage terminal and output the feedback voltage having a voltage level corresponding to a code value of a voltage control code; a voltage comparison unit configured to compare a voltage level of a target voltage with a voltage level of the internal voltage; and a voltage control code generation unit configured to adjust the code value of the voltage control code based on the comparison result of the voltage comparison unit.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
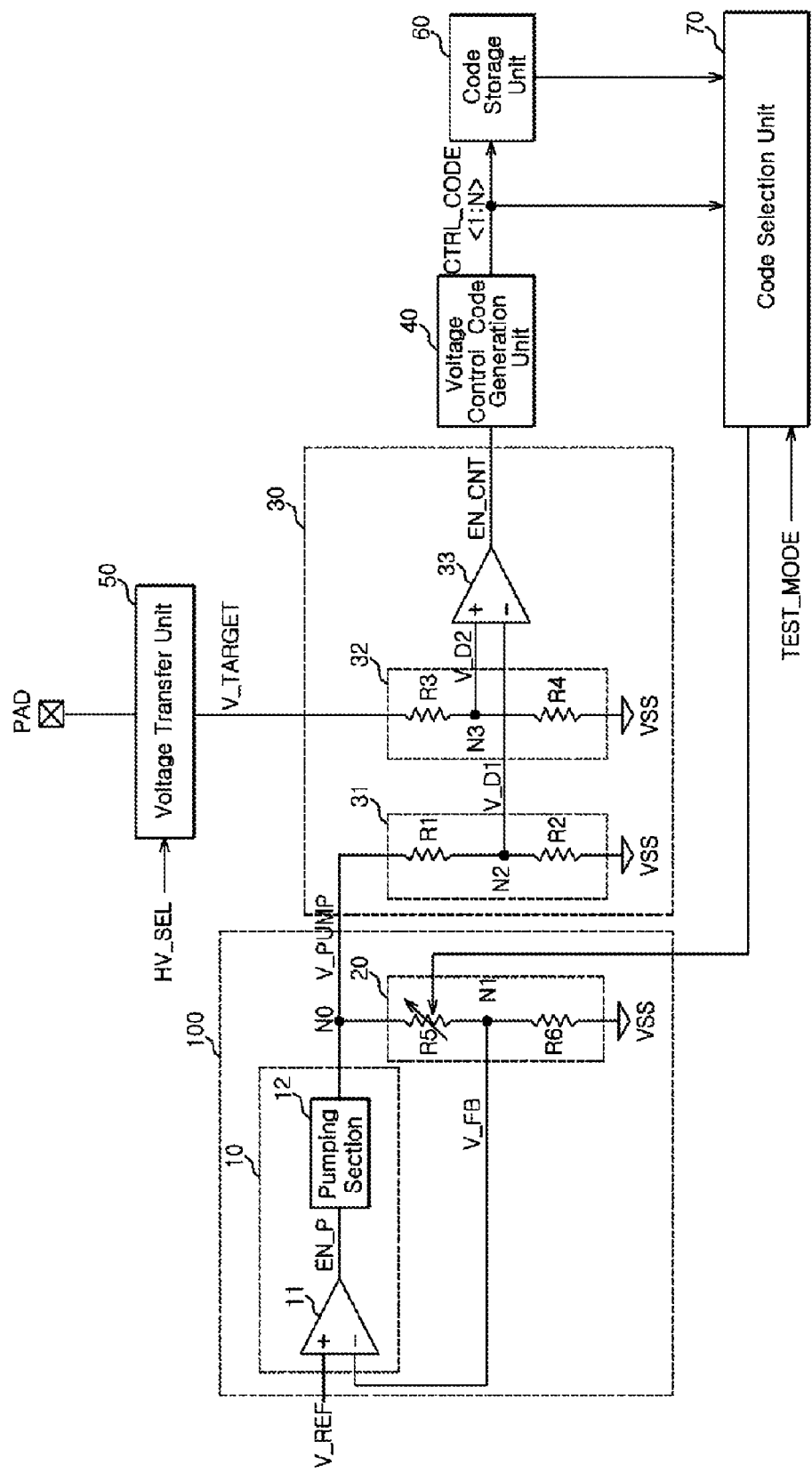
FIG. 1 is a schematic diagram illustrating a configuration of a semiconductor apparatus according to an exemplary embodiment of the present invention.

Reference will now be made in detail to the exemplary embodiments consistent with the present disclosure, examples of which are illustrated in the accompanying drawings. Wherever possible, the same reference characters will be used throughout the is drawings to refer to the same or like parts.

It should be noted, however, that certain terms, symbols, and signs used to designate certain devices, blocks, and other multi-part elements in the present disclosure may also be used to designate sub-elements as the occasion demands. Thus, the same terms, symbols, and signs may not necessarily designate the same devices, blocks, and elements in the disclosed circuitry. In general, the values of a circuit's logic signals and binary data are termed as either a high level (H) or a low level (L) depending on their voltage levels and, at certain occasions, may be represented as '1' and '0'. Furthermore, as the occasion demands, they may be defined and/or described to have a high impedance state (a high-Z state).

FIG. 1 is a schematic circuit diagram of a semiconductor apparatus according to an exemplary embodiment of the present invention. FIG. 1 depicts only a simplified configuration of an exemplary semiconductor apparatus for purposes of providing more clearer explanation of the technical features contemplated by the present invention. Thus, it should be explicitly noted that the exemplary semiconductor apparatus of FIG. 1 may include, although not depicted in the figure, any additional elements or materials that may be apparent to those skill in the art.

Referring to FIG. 1, the semiconductor apparatus may include an internal voltage generation unit 100, a voltage comparison unit 30, a voltage control code generation unit 40, a voltage transfer unit 50, a code storage unit 60, and a code selection unit 70. In some exemplary embodiments, the voltage transfer unit 50, the code storage unit 60, and/or the code selection unit 70 may be optionally provided.

The internal voltage generation unit 100 is configured to generate an internal voltage V_PUMP having a voltage level corresponding to a code value of a voltage control code CTRL_CODE<1:N>. In this embodiment, the internal voltage generation unit 100 includes a charge pumping section 10 and a voltage division section 20.

The charge pumping section 10 may be configured to compare a reference voltage V_REF with a feedback voltage V_FB, generate the internal voltage V_PUMP by performing a charge pumping according to the comparison result, and drive the generated internal voltage V_PUMP to an internal voltage terminal N0.

For example, the charge pumping section 10 includes a comparison section 11 and a pumping section 12. The comparison section 11 is configured to compare the voltage level of the reference voltage V_REF with the voltage level of the feedback voltage V_FB and selectively activate a pumping enable signal EN_P based on whether the voltage level of the reference voltage V_REF is higher or lower than the voltage level of the feedback voltage V_FB. The pumping section 12 is configured to generate the internal voltage V_PUMP when the pumping enable signal EN_P is activated by the is comparison section 11, and drive the generated internal voltage V_PUMP to the internal voltage terminal N0. In various exemplary embodiments, the pumping section 12 may comprise a plurality of capacitors.

The voltage division section 20 may be configured to divide a voltage of the internal voltage terminal N0 and output the feedback voltage V_FB. For example, the voltage division section 20 outputs the feedback voltage V_FB having a voltage level corresponding to the code value of the voltage control code CTRL_CODE<1:N>.

In this exemplary embodiment, the voltage division section 20 includes a variable resistor R5 and a resistor R6. The variable resistor R5 is coupled between the internal voltage terminal N0 and an output node N1 of the feedback voltage V_FB, and the resistance value of the variable resistor R5 is adjusted according to the code value of the voltage control code CTRL_CODE<1:N>. The resistor R6 is coupled between the output node N1 of the feedback voltage V_FB and a ground voltage terminal VSS.

The voltage transfer unit 50 may be configured to transfer a target voltage V_TARGET, which is inputted from outside through a pad, to the voltage comparison unit 30. The voltage transfer unit 50 may comprise a switch controlled by a voltage transfer signal HV_SEL. The target voltage V_TARGET may be defined as a voltage inputted from an external test apparatus. In some exemplary embodiments, the target voltage V_TARGET may be an internally generated voltage.

The voltage comparison unit 30 may be configured to compare the voltage level of the target voltage V_TARGET with the voltage level of the internal voltage V_PUMP. In this embodiment, the voltage comparison unit 30 includes a first voltage division section 31, a second voltage division section 32, and a comparison section 33.

The first voltage division section 31 includes a first resistor R1 and a second resistor R2 and is configured to divide the internal voltage V_PUMP and output a first division voltage V_D1.

The second voltage division section 32 includes a third resistor R3 and a fourth resistor R4 and is configured to divide the target voltage V_TARGET and output a second division voltage V_D2.

In this embodiment, a resistance ratio of the first resistor R1 to the second resistor R2 and a resistance ratio of the third resistor R3 to the fourth resistor R4 may be set to be substantially equal to each other. The comparison section 33 is configured to compare the first division voltage V_D1 with the second division voltage V_D2, and determine a signal level of a resultant signal EN_CNT based on the comparison result.

The voltage control code generation unit 40 is configured to adjust the code value of the voltage control code CTRL_CODE<1:N> based on the resultant signal EN_CNT from the voltage comparison unit 30. The voltage control code generation unit 40 may comprise a counter or a shift register.

The code storage unit 60 may be configured to store the voltage control code CTRL_CODE<1:N> outputted from the voltage control code generation unit 40. The code storage unit 60 may comprise a nonvolatile storage element. The code storage unit 60 stores the code value determined when the trimming of the internal voltage is completed.

The code selection unit 70 may be configured to provide the voltage control code stored in the code storage unit 60 to the internal voltage generation unit 100 in a normal mode. In addition, the code selection unit 70 may be configured to provide the voltage control code outputted from the voltage control code generation unit 40 to the internal voltage generation unit 100 in a test mode. The code selection unit 70 may comprise a plurality of switches controlled by a test signal TEST_MODE.

An exemplary method of trimming the internal voltage V_PUMP will be described herein. First, a voltage level of the target voltage V_TARGET inputted from an external test apparatus in the test mode is set to be substantially equal to the final target value of the internal voltage V_PUMP generated by the internal voltage generation unit 100.

When the initial level of the internal voltage V_PUMP outputted from the charge pumping section 10 is lower than the target voltage V_TARGET, the voltage comparison unit 30 activates the resultant signal EN_CNT. Since the resultant signal EN_CNT is activated, the code value of the voltage control code CTRL_CODE<1:N> outputted from the voltage control code generation unit 40 is increased. When the code value of the voltage control code CTRL_CODE<1:N> is increased, the resistance value of the variable resistor R5 of the voltage division section 20 is increased in proportion to the code value.

Thus, the voltage level of the feedback voltage V_FB is dropped. When the voltage level of the feedback voltage V_FB is dropped and becomes lower than the voltage level of the reference voltage V_REF, the pumping enable signal EN_P is activated. Since the pumping enable signal EN_P is activated, the pumping section 12 performs a charge pumping operation so that the voltage level of the internal voltage terminal N0 (i.e., the voltage level of the internal voltage V_PUMP) rises.

Such an operation is repetitively performed until the internal voltage V_PUMP reaches or nears the target voltage V_TARGET. When the voltage level of the internal voltage V_PUMP reaches the voltage level of the target voltage V_TARGET, the comparison section 33 deactivates the resultant signal EN_CNT. The code value of the voltage control code CTRL_CODE<1:N> at this point of time is stored in the code storage unit 60. In the normal mode, the internal voltage generation unit 100 generates the internal voltage V_PUMP under the control of the voltage control code CTRL_CODE<1:N> stored in the code storage unit 60.

Once the target voltage is applied from outside, the semiconductor apparatus according to various embodiments of the present invention may automatically perform the operation of trimming the internal voltage. Hence, the code value of the optimal voltage control code can be obtained more quickly.

Figure 2:
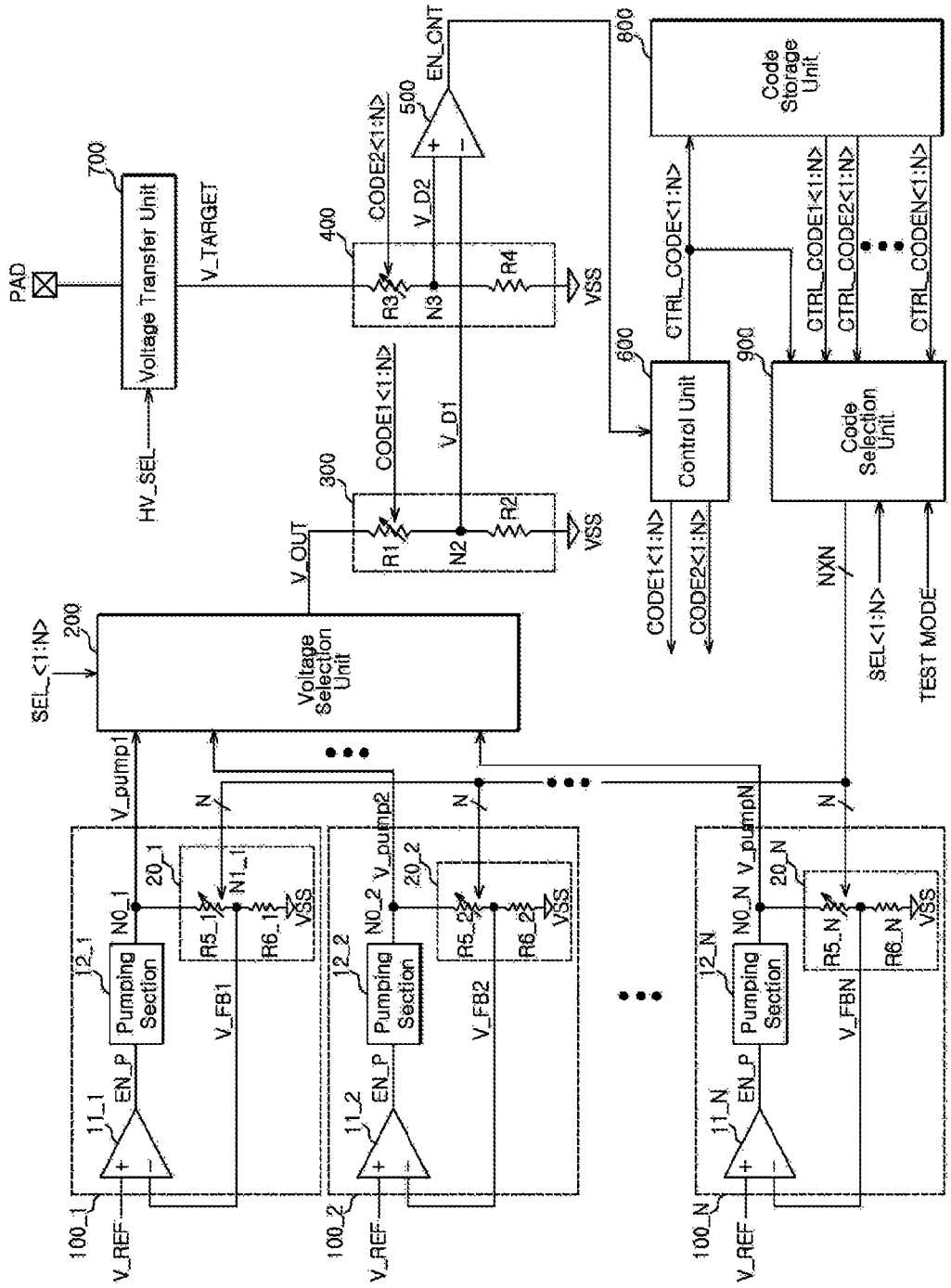
FIG. 2 is a schematic diagram illustrating a configuration of a semiconductor apparatus according to another exemplary embodiment of the present invention.

FIG. 2 is a schematic circuit diagram of a semiconductor apparatus according to another exemplary embodiment of the present invention. FIG. 2 depicts only a simplified configuration of an exemplary semiconductor apparatus to facilitate understanding of the technical features contemplated by the present embodiment.

Referring to FIG. 2, the semiconductor apparatus includes a plurality of internal voltage generation units 100_1 to 100_N, a voltage selection unit 200, a first voltage division unit 300, a second voltage division unit 400, a common voltage comparison unit 500, a control unit 600, a voltage transfer unit 700, a code storage unit 800, and a code selection unit 900. In some embodiments, the voltage transfer unit 700, the code storage unit 800, and the code selection unit 900 may be optionally provided.

The plurality of internal voltage generation units 100_1 to 100_N may be configured to generate a plurality of internal voltages V_pump1 through V_pumpN having voltage levels corresponding to code values of a plurality of voltage control codes CTRL_CODE1<1:N> through CTRL_CODEN<1:N>. In this embodiment, the plurality of internal voltages V_pump1 through V_pumpN each may have different levels. Since the plurality of internal voltage generation units 100_1 to 100_N are implemented with circuits having the substantially same structure or function, only the first internal voltage generation unit 100_1 will be representatively described below in detail.

The first internal voltage generation unit 100_1 generates the first internal voltage V_pump1 having the voltage level corresponding to the code value of the first voltage control code CTRL_CODE1<1:N>. In this embodiment, the first internal voltage generation unit 100_1 includes a comparison section 11_1, a pumping section 12_1, and a voltage division section 20_1.

The comparison section 11_1 is configured to compare the voltage level of the reference voltage V_REF with the voltage level of the feedback voltage V_FB1 and selectively activate a pumping enable signal EN_P based on whether the voltage level of the reference voltage V_REF is higher or lower than the voltage level of the feedback voltage V_FB1. The pumping section 12_1 is configured to generate the first internal voltage V_pump1 when the pumping enable signal EN_P is activated by the comparison section 11_1, and drive the generated first internal voltage V_pump1 to the first internal voltage terminal NO_1. In one exemplary embodiment, the pumping section 12_1 may comprise a plurality of capacitors.

The voltage division section 20_1 is configured to divide a voltage of the first internal voltage terminal N0_1 and output the feedback voltage V_FB1. For example, the voltage division section 20_1 outputs the feedback voltage V_FB1 having a voltage level corresponding to the code value of the first voltage control code CTRL_CODE1<1:N>.

In this embodiment, the voltage division section 20_1 includes a variable resistor R5_1 and a resistor R6_1. The variable resistor R5_1 is coupled between the first internal voltage terminal N0_1 and an output node N1_1 of the feedback voltage V_FB1, and the resistance value of the variable resistor R5_1 is adjusted according to the code value of the first voltage control code CTRL_CODE1<1:N>. The resistor R6_1 is coupled between the output node N1_1 of the feedback voltage V_FB1 and a ground voltage terminal VSS.

The voltage selection unit 200 may be configured to select one internal voltage among the plurality of internal voltages V_pump1 through V_pumpN by a plurality of voltage selection signals SEL_<1:N> and output the selected internal voltage as an output voltage V_OUT.

The voltage selection unit 200 may comprise a plurality of switches controlled by the plurality voltage selection signals SEL_<1:N>. In this embodiment, the internal voltage generation unit performs the voltage trimming operation to generate the internal voltage selected by the plurality of voltage selection signals SEL_<1:N>.

The voltage transfer unit 700 may be configured to transfer a target voltage V_TARGET, which is inputted from outside through a pad, to the second voltage division unit 400. The voltage transfer unit 700 may comprise a switch controlled by a voltage transfer signal HV_SEL. The target voltage V_TARGET may be defined as a voltage inputted from an external test apparatus. In some embodiments, the target voltage V_TARGET may be an internally generated voltage.

The first voltage division unit 300 may be configured to divide the output voltage V_OUT and output a first division voltage V_D1. The voltage level of the first division voltage V_D1 is adjusted according to a code value of a first control code CODE1<1:N>.

In this embodiment, the first voltage division unit 300 includes a first variable resistor R1 and a first resistor R2. The first variable resistor R1 is coupled between an output node of the output voltage V_OUT and an output node N2 of the first division voltage V_D1. The resistance value of the first variable resistor R1 is adjusted according to the code value of the first control code CODE1<1:N>. The first resistor R2 is coupled between the output node N2 of the first division voltage V_D1 and the ground voltage terminal VSS.

The second voltage division unit 400 may be configured to divide the target voltage V_TARGET and output a second division voltage V_D2. The voltage level of the second division voltage V_D2 is adjusted according to a code value of a second control code CODE2<1:N>.

In this embodiment, the second voltage division unit 400 includes a second variable resistor R3 and a second resistor R4. The is second variable resistor R3 is coupled between an input node of the target voltage V_TARGET and an output node N3 of the second division voltage V_D2. The resistance value of the second variable resistor R3 is adjusted according to the code value of the second control code CODE2<1:N>. The second resistor R4 is coupled between the output node N3 of the second division voltage V_D2 and the ground voltage terminal VSS.

The common voltage comparison unit 500 may be configured to compare the voltage level of the first division voltage V_D1 with the voltage level of the second division voltage V_D2, and determine a signal level of a resultant signal EN_CNT according to the comparison result.

The control unit 600 may be configured to adjust the code value of the voltage control code selected among the plurality of voltage control codes CTRL_CODE1<1:N> through CTRL_CODEN<1:N> based on the comparison result of the common voltage comparison unit 500 (e.g., under the control of the resultant signal EN_CNT) and output the preset first and second control codes CODE1<1:N> and CODE2<1:N>. The code values of the first and second control codes CODE1<1:N> and CODE2<1:N> are adjusted according to which one of the plurality of internal voltage generation units 100_1 to 100_N performs a trimming operation. The control unit 600 may comprise a resistor, a counter, and a shift register.

The code storage unit 800 may be configured to store the voltage control codes outputted from the control unit 600. The code storage unit 800 may comprise a nonvolatile storage element. The code storage unit 800 stores the plurality of code values determined when the trimming of the plurality of internal voltages V_pump1 through V_pumpN is completed.

The code selection unit 900 may be configured to provide the plurality of voltage control codes CTRL_CODE1<1:N> through CTRL_CODEN<1:N> stored in the code storage unit 800 to the plurality of internal voltage generation units 100_1 to 100_N, respectively, in a normal mode. In addition, the code selection unit 900 may be configured to provide the voltage control code outputted from the control unit 600 to the selected one of the plurality of internal voltage generation units 100_1 to 100_N during a test mode. The selected internal voltage generation unit is defined as an internal voltage generation unit that outputs the internal voltage selected by the plurality of voltage selection signals SEL_<1:N>.

Once the target voltage is applied from outside, the semiconductor apparatus according to the embodiment of the present invention automatically performs the operation of trimming the internal voltage. Hence, the code value of the optimal voltage control code can be obtained more quickly.

Moreover, the plurality of internal voltages V_pump1 through V_pumpN generated from the plurality of internal voltage generation units 100_1 to 100_N, respectively, can be selected through the plurality of voltage selection signals SEL_<1:N> and then trimmed.

Further, all of the internal voltages V_pump1 through V_pumpN can be trimmed through the first voltage division unit 300, the second voltage division unit 400, and the common voltage comparison unit 500. That is, the resistance value of the first variable resistor R1 of the first voltage division unit 300 is adjusted by adjusting the code value of the first control code CODE1<1:N>, and the resistance value of the second variable resistor R3 of the second voltage division unit 400 is adjusted by adjusting the code value of the second control code CODE2<1:N>.

Thus, using the single common voltage comparison unit 500, the target voltage V_TARGET can be compared with the plurality of internal voltages V_pump1 through V_pumpN having different levels. Therefore, the circuit area of the semiconductor apparatus can be reduced.

As described above, the semiconductor apparatus according to the embodiment of the present invention can reduce the internal voltage trimming time. Furthermore, the semiconductor apparatus according to the various embodiments of the present invention can quickly trim the plurality of internal voltages. As a result, the required circuit area can be reduced.

It should be understood that embodiments encompassing additional elements that may not be necessarily associated with the technical features of the present invention may also be contemplated is in order to describe the present invention in further detail. Moreover, an active high configuration or an active low configuration for indicating the activated states of signals and circuits may vary depending upon a specific embodiment of the present invention.

It should also be understood that, in order to achieve the same function, the configurations of logic gates may be changed as the occasion demands. That is to say, NANDing elements, NORing elements, etc. can be configured through various combinations of NAND gates, NOR gates, inverters, and so forth. Since these circuit changes can have a large number of variations and can be easily inferred by those skilled in the art, the enumeration thereof will be omitted herein.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
an internal voltage generation unit configured to generate an internal voltage having a voltage level corresponding to a code value of a voltage control code;
a voltage comparison unit configured to compare a voltage level of a target voltage with a voltage level of the internal voltage, the voltage comparison unit comprising:
a first voltage division section configured to divide the internal voltage and output a first division voltage;
a second voltage division section configured to divide the target voltage and output a second division voltage; and
a comparison section configured to compare the first division voltage with the second division voltage; and
a voltage control code generation unit configured to adjust the code value of the voltage control code based on the comparison result of the voltage comparison unit.

2. The semiconductor apparatus according to claim 1, further comprising a voltage transfer unit configured to receive the target voltage from outside and transfer the target voltage to the voltage comparison unit.

3. The semiconductor apparatus according to claim 1, further comprising a code selection unit configured to provide the voltage control code outputted from the voltage control code generation unit to the internal voltage generation unit in a test mode.

4. The semiconductor apparatus according to claim 3, further comprising a storage unit configured to store the voltage control code outputted from the voltage control code generation unit, wherein the code selection unit is configured to provide the voltage control code stored in the storage unit to the internal voltage generation unit in a normal mode.

5. The semiconductor apparatus according to claim 1, wherein the internal voltage generation unit comprises:
a comparison section configured to compare a reference voltage with a feedback voltage having a voltage level corresponding to a code value of the voltage control code; and
a pumping section configured to generate the internal voltage by performing a charge pumping based on the comparison result of the comparison section, and drive the generated internal voltage to an internal voltage terminal.

6. The semiconductor apparatus according to claim 5, wherein the internal voltage generation unit further comprises a voltage division section configured to divide a voltage of the internal voltage terminal and output the feedback voltage to the comparison section of the voltage generation unit.

7. The semiconductor apparatus according to claim 6, wherein the voltage division section comprises:
   a variable resistor coupled between the internal voltage terminal and an output node of the feedback voltage and having a resistance value adjusted according to the code value of the voltage control code; and
   a resistor coupled between the output node of the feedback voltage and a ground voltage terminal.

8. A semiconductor apparatus comprising:
   a plurality of internal voltage generation units configured to generate a plurality of internal voltages having voltage levels corresponding to code values of a plurality of voltage control codes, respectively;
   a voltage selection unit configured to select one internal voltage among the plurality of internal voltages based on a plurality of voltage selection signals and output the selected internal voltage as an output voltage;
   a first voltage division unit configured to divide the output voltage and output a first division voltage having a voltage level corresponding to a code value of a first control code;
   a second voltage division unit configured to divide a target voltage and output a second division voltage having a voltage level corresponding to a code value of a second control code;
   a voltage comparison unit configured to compare a voltage level of the first division voltage with a voltage level of the second division voltage; and
   a control unit configured to adjust the code value of the voltage control code selected among the plurality of voltage control codes based on the comparison result of the voltage comparison unit, and set the code values of the first and second control codes.

9. The semiconductor apparatus according to claim 8, further comprising a voltage transfer unit configured to receive the target voltage from outside and transfer the target voltage to the second voltage division unit.

10. The semiconductor apparatus according to claim 8, further comprising a code selection unit configured to provide the voltage control code to the internal voltage generation unit selected among the plurality of internal voltage generation units.

11. The semiconductor apparatus according to claim 10, further comprising a storage unit configured to store the voltage control codes outputted from the control unit, wherein the code selection unit is configured to provide the plurality of voltage control codes stored in the code storage unit to the plurality of internal voltage generation units in a normal mode.

12. The semiconductor apparatus according to claim 8, wherein at least one of the plurality of internal voltage generation units comprises:
   a comparison section configured to compare a reference voltage with a feedback voltage having a voltage level corresponding to a code value of an allocated voltage control code; and
   a pumping section configured to generate an internal voltage is by performing a charge pumping according to the comparison result of the comparison section.

13. The semiconductor apparatus according to claim 12, wherein at least one of the plurality of internal voltage generation units comprises a voltage division section configured to divide the internal voltage and output the feedback voltage to the comparison section.

14. The semiconductor apparatus according to claim 13, wherein the voltage division section comprises:
   a variable resistor coupled between an output node of the internal voltage and an output node of the feedback voltage and having a resistance value adjusted according to the code value of the allocated voltage control code; and
   a resistor coupled between the output node of the feedback voltage and a ground voltage terminal.

15. The semiconductor apparatus according to claim 8, wherein the first voltage division unit comprises:
   a first variable resistor coupled between an output node of the output voltage and an output node of the first division voltage and having a resistance value adjusted according to the code value of the first control code; and
   a first resistor coupled between the output node of the first is division voltage and a ground voltage terminal.

16. The semiconductor apparatus according to claim 15, wherein the second voltage division unit comprises:
   a second variable resistor coupled between an input node of the target voltage and an output node of the second division voltage and having a resistance value which is adjusted according to the code value of the second control code; and
   a second resistor coupled between the output node of the second division voltage and the ground voltage terminal.

17. A semiconductor apparatus comprising:
   a charge pumping unit configured to generate an internal voltage by performing a charge pumping based on a result of comparison between a reference voltage and a feedback voltage, and drive the generated internal voltage to an internal voltage terminal;
   a voltage division unit configured to divide a voltage of the internal voltage terminal and output the feedback voltage having a voltage level corresponding to a code value of a voltage control code;
   a voltage comparison unit configured to compare a voltage level of a target voltage with a voltage level of the internal voltage;
   a voltage control code generation unit configured to adjust the code value of the voltage control code based on the comparison result of the voltage comparison unit; and
   a voltage transfer unit configured to receive the target voltage from outside and transfer the target voltage to the voltage comparison unit.

18. The semiconductor apparatus according to claim 17, further comprising a code selection unit configured to provide the voltage control code outputted from the voltage control code generation unit to the internal voltage generation unit in a test mode.

19. The semiconductor apparatus according to claim 18, further comprising a code storage unit configured to store the voltage control code outputted from the voltage control code generation unit, wherein the code selection unit is configured to provide the voltage control code stored in the code storage unit to the internal voltage generation unit in a normal mode.

20. The semiconductor apparatus according to claim 17, wherein the charge pumping unit comprises:
   a comparison section configured to compare the reference voltage with the feedback voltage; and a pumping section configured to perform a charge pumping based on the comparison result of the comparison section.

21. The semiconductor apparatus according to claim 17, wherein the voltage division unit comprises:
  a variable resistor coupled between the internal voltage terminal and an output node of the feedback voltage and having a resistance value adjusted according to the code value of the voltage control code; and
  a resistor coupled between the output node of the feedback voltage and a ground voltage terminal.

22. The semiconductor apparatus according to claim 17, wherein the voltage comparison unit comprises:
  a first voltage division section configured to divide the internal voltage and output a first division voltage;
  a second voltage division section configured to divide the target voltage and output a second division voltage; and
  a comparison section configured to compare the first division voltage with the second division voltage.

* * * * *